(12) United States Patent
Hyodo et al.

(10) Patent No.: US 7,045,473 B2
(45) Date of Patent: May 16, 2006

(54) SOLID MATERIAL GASIFICATION METHOD, THIN FILM FORMATION PROCESS AND APPARATUS

(75) Inventors: Hiroyuki Hyodo, Kawasaki (JP);
Hideki Yamawaki, Kawasaki (JP);
Kenji Maruyama, Kawasaki (JP);
Masaharu Hida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/662,474

(22) Filed: Sep. 16, 2003

(65) Prior Publication Data

US 2004/0058510 A1    Mar. 25, 2004

(30) Foreign Application Priority Data

Sep. 24, 2002    (JP) .............................. 2002-277306

(51) Int. Cl.
*H01L 21/324* (2006.01)
*C23C 16/00* (2006.01)

(52) U.S. Cl. ....................... 438/795; 118/715
(58) Field of Classification Search ................ 118/715; 438/795
See application file for complete search history.

(56) References Cited

U.S. PATENT DOCUMENTS

| | | | |
|---|---|---|---|
| 5,186,120 A * | 2/1993 | Ohnishi et al. | 118/667 |
| 6,243,508 B1 * | 6/2001 | Jewell et al. | 385/14 |
| 6,581,649 B1 * | 6/2003 | Jursich | 141/5 |
| 2002/0023588 A1 * | 2/2002 | Yamamuka et al. | 118/715 |
| 2002/0043215 A1 * | 4/2002 | Yoshioka et al. | 118/715 |
| 2003/0129306 A1 * | 7/2003 | Wade et al. | 427/255.28 |
| 2004/0144399 A1 * | 7/2004 | McDermott et al. | 134/1 |

FOREIGN PATENT DOCUMENTS

| | | |
|---|---|---|
| JP | 5-311446 | 11/1993 |
| JP | 7-76778 | 3/1995 |
| JP | 10-298762 | 11/1998 |

* cited by examiner

*Primary Examiner*—W. David Coleman
(74) *Attorney, Agent, or Firm*—Westerman, Hattori, Daniels & Adrian, LLP (57) ABSTRACT

Solid material gasification method comprises a solution preparation step wherein a first solid material is dissolved in a solvent to prepare a gasification solution, a solvent removal step wherein a second solid material is separated by removing the solvent used to prepare the gasification solution from that solution, and a solid sublimation step wherein the second solid material is gasified by sublimation.

15 Claims, 3 Drawing Sheets

SOLID MATERIAL GASIFICATION METHOD, THIN FILM FORMATION PROCESS AND APPARATUS

CROSS-REFERENCE TO RELATED APPLICATIONS

This application is based upon and claims a priority of Japanese Patent Application No. 2002-277306, filed on Sep. 24, 2002, the contents being incorporated herein by reference.

BACKGROUND OF THE INVENTION

1. Field of the Invention

The present invention relates to a solid material gasification method and apparatus as well as a thin film formation process and apparatus. The present invention can be advantageously used for CVD and other thin film formation processes, and is therefore useful in the production of semiconductor devices and so forth.

2. Description of the Related Art

One of the production steps of semiconductor devices includes a process for forming a thin film by gasifying a solid raw material, and such processes are commonly known and widely used. In addition, known examples of such thin film formation processes include sputtering, vacuum vapor deposition and chemical vapor deposition (CVD). In such thin film formation processes, the following types of processes are generally used to gasify solid raw materials. For example, in the case of forming a thin film of an oxide of an organometallic compound on the surface of a substrate by CVD, after sublimating the solid raw material (powder), the generated reactive gas is introduced into a CVD device and adhered onto a treated substrate (see, Japanese Unexamined Patent Publication (Kokai) No. 5-311446). In addition, after dissolving the solid raw material in a solvent such as tetrahydrofuran (THF), butyl acetate or hexane, the resulting solution is vaporized and introduced into a CVD device where it can also be adhered to a treated substrate (see, Japanese Unexamined Patent Publication (Kokai) Nos. 7-76778 and 10-298762).

However, in these conventional thin film formation processes, several important problems remain unresolved. For example, in the case of carrying out thin film formation using a sublimation process, as the solid raw material must be maintained in a heated state at all times, it is difficult to avoid deterioration of the composition and properties of the thin film attributable to decomposition of the raw material. In addition, in the case of a using a solvent vaporization process, there is the problem of the generation of residue and particles caused by separation and vaporization of solvent. Moreover, there are also cases in which film deposition is inhibited during the early stages of thin film formation due to the reducing action of the solvent.

SUMMARY OF THE INVENTION

An object of the present invention is to provide a solid material gasification method that enables stable and simple gasification of a solid raw material.

In addition, another object of the present invention is to provide an apparatus that is useful for carrying out such a gasification method.

Moreover, another object of the present invention is to provide a thin film formation process that enables simple and stable film formation unaccompanied by deterioration of composition or properties during thin film formation or the generation of residue and particles.

Furthermore, still another object of the present invention is to provide an apparatus that is useful for carrying out such a thin film formation process.

As a result of conducting earnest research to find a method that did not require the use of a sublimation process or solvent vaporization process of the prior art, in the case of preparing a reactive gas used for thin film formation and so forth by gasifying from a solid material, the inventors of the present invention found that sequentially carrying out the gasification of a solid material in a stepwise manner, namely, a step wherein a gasification solution is prepared by dissolving a solid raw material (referred to as a "first solid material" in particular in the present specification) in a solvent, a step wherein the gasification solution is heated to a prescribed temperature and the solvent is removed to recover the solid material (or in other words, a step in which only the solvent is vaporized), and a step wherein the solid material remaining following removal of solvent (referred to as a "second solid material" in particular in the present specification) is sublimated and gasified by heating to a prescribed temperature, is effective for this purpose, thereby leading to completion of the present invention as explained in detail below.

According to one aspect of the present invention, there is provided a solid material gasification method comprising:

a solution preparation step wherein a first solid material is dissolved in a solvent to prepare a gasification solution, a solvent removal step wherein a second solid material is separated by removing the solvent used to prepare the gasification solution from that solution, and a solid sublimation step wherein the second solid material is gasified by sublimation.

In addition, in another aspect of the present invention, there is provided an apparatus for gasifying a solid material comprising:

a solvent removal chamber provided with an inlet port for a gasification solvent containing a first solid material and a solvent in which it is dissolved, a heating device that vaporizes the solvent used to prepare the gasification solution by heating that solution, and an exhaust port that removes the vaporization product of the solvent, and a solid sublimation chamber, either used as the solvent removal chamber or arranged communicably adjacent to it, provided with a heating device that gasifies a second solid material separated by removal of the solvent by sublimation.

Moreover, in another aspect of the present invention, there is provided a process of forming a thin film comprising:

a solution preparation step wherein a first solid material is dissolved in a solvent to prepare a gasification solution, a solvent removal step wherein a second solid material is separated by removing the solvent used to prepare the gasification solution from that solution, a solid sublimation step wherein a reactive gas is generated by sublimating the second solid material, and a film formation step wherein the thin film is deposited on a treated substrate by using the reactive gas as raw material.

Furthermore, in still another aspect of the present invention, there is provided an apparatus for forming a thin film from a solid material comprising:

a solvent removal chamber provided with an inlet port of a gasification solvent containing a first solid material and a solvent in which it is dissolved, a heating device that vaporizes the solvent used to prepare the gasification solution by heating that solution, and an exhaust port that removes the vaporization product of the solvent, a solid sublimation chamber, either used as the solvent removal chamber or arranged communicably adjacent to it, provided with a heating device that gasifies a second solid material separated by removal of the solvent by sublimation, and a film formation chamber wherein the thin film is deposited on a treated substrate using as raw material the reactive gas generated from the second solid material in the solid sublimation chamber or combination solvent removal/solid sublimation chamber.

DESCRIPTION OF THE PREFERRED EMBODIMENTS

The present invention provides a solid material gasification method and apparatus, as well as a process and apparatus for forming a thin film using a reactive gas generated from a solid material according to the gasification method and apparatus of the present invention, and each of these can be advantageously carried out in various embodiments.

In the practice of the present invention, there are no particular restrictions on the technical field of gasification or thin film formation. Examples of suitable technical fields include, but are not limited to, the field of the production of semiconductor devices and other electronic equipment. This is because electronic equipment requires accurate microprocessing through the incorporation of electronic elements and so forth, and the importance of thin film formation technology is therefore considerable more specifically, when the gasification or thin film formation technology of the present invention is used, high-performance insulating films, electrode wiring films, semiconductor films and other thin films can be formed easily and with good yield. A thin film formation step itself following a gasification step can be advantageously carried out by using a commonly used film deposition process and film deposition device. For example, examples of film deposition devices preferable for carrying out the present invention include, but are not limited to, a film deposition device widely used during the formation of a thin film by gasifying a solid raw material in the production of a semiconductor device, such as a sputtering device, vacuum deposition device, epitaxial growth device, PVD device or CVD device. The following provides an explanation of the present invention with reference to a CVD device, which is expected to be the most effective in the present invention.

A method for gasifying a solid material according to the present invention is specifically composed of the following three steps:

a solution preparation step wherein a first solid material is dissolved in a solvent to prepare a gasification solution, a solvent removal step wherein a second solid material is separated by removing the solvent used to prepare the gasification solution from that solution, and a solid sublimation step wherein the second solid material is gasified by sublimation.

Here, a first solid material refers to a solid raw material capable of deriving a target gas in accordance with the present invention, and in particular, a reactive gas required for forming a thin film. Thus, there are no particular restrictions on this first solid material, and any arbitrary solid raw material may be used alone or by mixing two or more types according to the composition of the target thin film (for example, compound semiconductor thin film, metal oxide thin film and so forth). In the case of using two or more types of solid raw materials in combination, that combination may be altered over a wide range.

The first solid material preferably contains at least one type of organometallic compound if, for example, the generated reactive gas is desired to be used for forming a thin film of a metal oxide. Examples of suitable organometallic compounds include, but are not limited to, $Pb(DPM)_2$, $Zr(DPM)_4$, $Ti(iPrO)_2(DPM)_2$, $Ba(DPM)_2$, $Sr(DPM)_2$, $Ta(OEt)_4$ and $Bi(DPM)_3$.

In the present invention, a process is not adopted in which this first solid material is gasified by sublimating directly as in the prior art. Namely, a first solid material is dissolved in a suitable solvent to prepare a gasification solution of a prescribed concentration. Here, in addition to being able to easily dissolve the solid material, the solvent is also preferably able to be vaporized easily by heating at a comparatively low temperature in a later solvent removal step. Preferable examples of solvents include tetrahydrofuran (THF), butyl acetate and the like. In addition, although the first solid material can be dissolved in this solvent at various concentrations, normally it is preferably ultimately dissolved in the amount required for generating the reactive gas required for film formation. If an excess amount of solid material is not contained, there is hardly any reactive gas remaining at completion of film formation. Thus, maintenance of the film deposition device can be performed easily, and expensive raw materials are not wasted. In general, the concentration of the first solid material is within the range of about 0.03 to 0.3 mol % based on the total amount of gasification solution. Dissolving of the solid material can be advantageously carried out by a method such as adding the solid material to a container containing the solvent and then mixing uniformly with a stirring device.

After the gasification solution has been prepared in the manner described above, only the solvent is selectively removed from that solution. Although this solvent removal step can be carried out by various methods, it is advantageous to remove the solvent by heating the gasification solution to a temperature required to vaporize the solvent contained therein, and then vaporize the solvent in the stage prior to sublimation of the solid material. Although the heating temperature in this case varies according to the type of solvent, it is normally a comparatively low temperature of about 60 to 150° C. Since solvent removal is carried out at such a low temperature, the occurrence of a reaction by the solid material contained in the gasification solution, and the formation of undesirable decomposition products can be prevented, and the generation of particles can also be suppressed. Examples of heating means that can be used include an infrared heater, resistance heater and high-frequency heater.

The solvent removal step may be modified in various ways to enhance treatment efficiency or shorten treatment time. In general, a solution dissemination means such as a spraying tube or nozzle is provided in the upper section of the treatment chamber for removing solvent in order to disseminate the gasification solution, and heating is preferably carried out while uniformly dispersing the gasification solution in the treatment chamber. Only one or a combination of two or more of these solution dissemination means may be arranged. In addition, a nozzle in the form of a straight tube in which a large number of dissemination holes are provided in its periphery may be made to extend from the upper section to the central section of the treatment chamber. Moreover, a disc-shaped dissemination nozzle may be attached to the upper section of the treatment chamber, and gasification solution may be sprayed from that dissemination nozzle.

Alternatively, instead of spraying the gasification solution, the gasification solution may be temporarily absorbed into a solid carrier capable of temporarily retaining the gasification solution. In this case, the solvent can be selectively removed by heating the solid carried impregnated with gasification solution at a low temperature, and by then continuing to heat the remaining solid carrier at a high temperature, the entire amount can be sublimated and recovered as reactive gas in a single round of heating unaccompanied by decomposition. In addition, in the case of using such a solid carrier, it is preferable to impregnate the solid carrier with only a fixed amount of gasification solution required for film formation. This is because, as only the required amount of solid material remains in the solid carrier following vaporization of solvent, when this is heated to the sublimation temperature of the solid material, there is virtually no solvent or solid material remaining in the solid carrier following recovery of reactive gas, thereby allowing the solid carrier to be reused without requiring troublesome cleaning or other post-treatment.

The second solid material can be separated as a result of removing the solvent in the manner described above. This solid material can normally be separated in a form that adheres to the inner walls of the treatment chamber, is typically adhered to the inner walls of the treatment chamber in the form of a fine solid powder. In the case the inner walls of the treatment chamber are porous, a portion of the solid powder is typically impregnated within the pores. In addition, according to a method in which a solid carrier is used separately, normally, the second solid material can be adhered in the form of a fine solid powder to at least the surface portion of the solid carrier. This solid carrier is also preferably composed of a porous material. Furthermore, the removed solvent may be recovered or reused by discharging from an exhaust port in the treatment chamber.

Next, in the solvent removal step, the second solid material separated in the form of a fine solid powder is preferably gasified by sublimation. This solid sublimation step can be advantageously carried out by heating to the sublimation temperature of the second solid material. Although varying according to the type of solid material, the heating temperature in this case is normally a comparatively high temperature of about 200 to 300° C. As a result of a single heating, the entire amount of the solid material is sublimated, and there is no fine solid powder remaining in the treatment chamber.

However, when carried out in accordance with the present invention, the solvent removal step and solid sublimation step may be carried out sequentially in mutually independent treatment chambers, or they may be carried out sequentially in a single treatment chamber. Regardless of either approach, they can be carried out advantageously by adding modifications to the configuration of the treatment chamber(s). Furthermore, normally, the treatment chamber is preferably composed of a closed space. Namely, the treatment chamber may be composed in the form of a sealable reaction tank or reaction chamber made of stainless steel and so forth, and may be installed with an opening and closing gate, raw material supply tube, exhaust port and other required equipment.

For example, in the case of carrying out the solvent removal step and solid sublimation step in separate treatment chambers, arranging the two treatment chambers adjacent to each other is preferable in terms of enhancing treatment efficiency. It is particularly preferable to arrange the treatment chamber of the solvent removal step and the following treatment chamber of the solid sublimation step separated by an opening and closing partition in combination with the use of a solid carrier for adsorbing the solid material. By adopting a shape and size that allows movement of the solid carrier through both treatment chambers, the solid carrier can be transported from the solvent removal chamber to the solid sublimation chamber according to the progress of the treatment process, thereby making it possible to carry out treatment both continuously and efficiently.

A solid carrier capable of moving within the treatment chambers can be formed from various materials and in various shapes. Basically, the solid carrier is preferably composed of a porous material for effectively recovering the second solid material separated by removal of solvent. Preferable examples of porous materials include, but are not limited to, porous metal materials such as a sintered product of stainless steel, or a porous ceramic material such as alumina or silica. A cylindrical cell and so forth is useful for the shape of these porous materials in consideration of handling ease and so forth. The second solid material can be adhered to such a solid carrier in the form of a fine solid powder.

More particularly, in the case of carrying out solvent removal in a single treatment chamber, and carrying out solid sublimation in another treatment chamber adjacent to it, the gasification method of the present invention can be carried out according to, for example, the following procedure.

Supply of Gasification Solution:

A gasification solution prepared in situ or at a different location is supplied to a porous solid carrier (for example, a stainless steel sintered product as mentioned above) arranged in the treatment chamber for removing solvent (solvent removal chamber). The solid carrier may be carried in directly to the solvent removal chamber, or may be stocked in treatment preparation chamber in front of it, and then sequentially carried into the solvent removal chamber from that chamber. In the case of combining the use of a treatment preparation chamber, the carrying in of the solid carrier to the solvent removal chamber can be carried out continuously on demand to improve workability. As the solid carrier used in this step is at least required to be moved from the solvent removal chamber to the adjacent solid sublimation chamber, it preferably has a suitably compact form and is capable of absorbing an adequate amount of gasification solution in a simple operation. Preferable examples of a solid carrier include a cylindrical cell. In addition, in order to carry out treatment continuously, it is preferable that the solid carrier be composed to be able to be moved through the treatment chambers by a conveyor or other transport means.

The supply of gasification solution to a cylindrical cell or other solid carrier can be carried out by various methods. For example, a solution flow path may be provided in the core section of the cylindrical cell, gasification solution is made to flow through that solution flow path when the cell is placed in the solvent removal chamber, and a gasification solution is uniformly dispersed throughout the entire cell through the pores in the cell. Alternatively, a gasification solution may be injected or sprayed from the periphery of a stationary or rotating solid carrier. In such cases, the gasification solution is preferably sprayed towards the solid carrier with, for example, a spraying tube or rotating nozzle in order to uniformly absorb a suitable amount of gasification solution into the solid carrier. In this manner, an amount of gasification solution is supplied to the solvent removal chamber that is adequate for ultimately supplying a desired amount of reactive gas. Supplying a smaller amount of gasification solution is not preferable since it is unable to provide the desired amount of reactive gas. Conversely, supplying a greater amount of gasification solution is also not preferable since excess solid material remains in the solid carrier, ultimately requiring the performance of complex removal work. As a result of supplying a suitable amount of gasification solution to the solid carrier in accordance with the present invention, not only can a stable supply of reactive gas be secured, but decomposition of the gas can be prevented and maintenance of the device can be simplified. Moreover, as the reactive gas is not contaminated by residue or particles, there is no appearance of detrimental effects (such as inhibition of film deposition) in thin film formation using this reactive gas.

Removal of Solvent:

After absorbing a suitable amount of gasification solution into the solid carrier, the solvent removal chamber is heated to a temperature that is equal to or slightly higher than the vaporization temperature of the solvent of the gasification solution. A suitable heating temperature and time are selected to facilitate efficient solvent vaporization. For example, in the case of using THF for the solvent, a suitable heating temperature and time are, for example, about 60 to 100° C. and about 3 to 10 minutes. As heating at an extremely high temperature has the risk of causing sublimation of the solid material, it is preferable to avoid the application of such temperatures. The vaporized solvent is discharged to the outside from an exhaust port in the solvent removal chamber. As the solvent is completely removed, the second solid material remains on the surface and inner pores of the solid carrier in the form of being adhered in the form of fine solid particles.

Sublimation of Solid Material:

Following completion of solvent removal, the solid carrier is transported from the solvent removal chamber to the following solid sublimation chamber. The solid sublimation chamber is arranged adjacent to the solvent removal chamber to improve workability and prevent contamination by impurities and so forth, and preferably employs a constitution that allows the solid carrier to be carried in easily by the opening and closing of a gate valve. After the solid carrier has been carried into the solid sublimation chamber, the solid sublimation chamber is heated to a temperature equal to or slightly higher than the sublimation temperature of the second solid material. A suitable heating temperature and time are selected to carry out solid sublimation efficiently. For example, in the case of using $Pb(DPM)_2$ as the second solid material, the preferable heating temperature and heating time are, for example, about 200 to 300° C. and about 3 to 10 minutes. Due to this heating, solid material adhered to the solid carrier is rapidly sublimated resulting in the generation of reaction gas (this gas is specifically referred to as "reactive gas" in the present application). The generated reactive gas fills the treatment chamber, and solid material adhered to the solid carrier is no longer observed. The used solid carrier that has been removed from the solid sublimation chamber may be reused by returning to the treatment preparation chamber or solvent removal chamber after performing cleaning treatment as necessary.

Discharge of Reactive Gas:

Reactive gas prepared in the manner described above is extracted from an exhaust port in the solid sublimation chamber. Although this reactive gas may be filled directly into a tank and so forth and transported to a different workplace or factory, it is preferable to promptly use the gas by supplying to a nearby or adjacently arranged reaction device (e.g., CVD device). The supply of reactive gas from the solid sublimation chamber to a reaction device preferably combines the use of an inert carrier gas such as nitrogen gas or argon gas so that the reactive gas is transferred with this carrier gas.

According to the present invention, the solvent removal step and solid sublimation step may also be advantageously carried out in a single treatment chamber (combination solvent removal/solid sublimation chamber). In the case of this approach as well, although the previously mentioned solid carrier may be used to adsorb the gasification solution and be carried in and out of the treatment chamber, as the constitution of the treatment chamber becomes complicated and treatment work becomes complex, the solid carrier is preferably composed by means of porous inner walls (lining) of the treatment chamber.

Here, examples of porous materials useful for the lining of the treatment chamber include, but are not limited to, porous metal materials such as a stainless steel sintered compact, and porous ceramic materials. In these porous linings, the density and pore diameter of the pores can be altered over a wide range corresponding to the desired solid capturing effects and subsequent solid sublimation effects. Similar to the movable solid carrier previously mentioned, the second solid material can also be adhered to such a lining in the form of a fine solid powder.

More particularly, in the case of consistently and continuously carrying out the process from solvent removal to solid sublimation using a single treatment chamber for both solvent removal and solid sublimation, the gasification method of the present invention can be carried out using, for example, the procedure described below.

A gasification solution either prepared locally or at a different location is supplied to a treatment chamber. In this case, contrivances are preferably made in the supply method of the gasification solution so that a large amount of the gasification solution is uniformly absorbed into a porous material serving as the lining of the treatment chamber. For example, a suitable method is to disseminate the gasification solution in the treatment chamber with a spraying tube or rotating nozzle and so forth. In this manner, an amount of gasification solution is supplied to the treatment chamber that is adequate for ultimately supplying the desired amount of reactive gas. The supply of a smaller amount of gasification solution is not desirable as the desired amount of reactive gas cannot be obtained. Conversely, the supply of a greater amount of gasification solution is not desirable as excess solid material ends up remaining on the inner walls of the treatment chamber, thereby ultimately requiring bothersome removal work. If a suitable amount of gasification solution is supplied in accordance with the present invention, not only can a stable supply of reactive gas be secured, but gas decomposition can be prevented and maintenance of the device can be simplified. Moreover, as the reactive gas is not contaminated by residue or particles, there is no appearance of detrimental effects (such as inhibition of film deposition) in thin film formation using this reactive gas.

Removal of Solvent:

After supplying a suitable amount of gasification solution to the treatment chamber, the treatment chamber is heated to a temperature that is equal to or slightly higher than the vaporization temperature of the solvent. A suitable heating temperature and time are selected to facilitate efficient solvent vaporization. For example, in the case of using THF for the solvent, a suitable heating temperature and time are, for example, about 60 to 100° C. and about 3 to 10 minutes. Since heating at an extremely high temperature has the risk of causing sublimation of the solid material, it is preferable to avoid the application of such temperatures. The vaporized solvent is discharged to the outside from an exhaust port. As the solvent is completely removed, the second solid material remains on the inner walls of the treatment chamber in the form of being adhered in the form of fine solid particles.

Sublimation of Solid Material:

The treatment chamber is heated to a temperature equal to or slightly higher than the sublimation temperature of the second solid material. A suitable heating temperature and time are selected to carryout solid sublimation efficiently. For example, in the case of using $Pb(DPM)_2$ as the second solid material, the preferable heating temperature and heating time are, for example, about 200 to 300° C. and about 3 to 10 minutes. Due to this heating, solid material adhered to the inner walls of the treatment chamber is rapidly sublimated resulting in the generation of reaction gas (this gas is specifically referred to as "reactive gas" in the present application). The generated reactive gas fills the treatment chamber, and solid material adhered to the inner walls of the treatment chamber is no longer observed.

Discharge of Reactive Gas:

A reactive gas prepared in the manner described above is extracted from an exhaust port in the treatment chamber. Although this reactive gas may be filled directly into a tank and so forth and transported to a different workplace or factory, it is preferable to promptly use the gas by supplying to a nearby or adjacently arranged reaction device. The supply of reactive gas from the treatment chamber to a reaction device preferably combines the use of an inert carrier gas such as nitrogen gas or argon gas so that the reactive gas is transferred with this carrier gas.

In the case of discharged reactive gas from the treatment chamber, there is hardly any solid material remaining in the treatment chamber. As a result, a treatment chamber that has been used in the above series of treatment steps can again be immediately used in the next series of treatment steps, or can be used in the next series of treatment steps following a simple maintenance treatment.

The apparatus for gasifying a solid material according to the present invention is provided with treatment chambers required to carry out each of the treatment steps corresponding to the previously described gasification method according to the present invention, namely:

a solvent removal chamber provided with an inlet port of a gasification solvent containing a first solid material and a solvent in which it is dissolved, a heating device that vaporizes the solvent used to prepare the gasification solution by heating that solution, and an exhaust port that removes the vaporization product of the solvent, and, a solid sublimation chamber either also used as the solvent removal chamber or arranged communicably adjacent to it, and provided with a heating device that gasifies a second solid material separated by removal of the solvent by sublimation.

Although it can be easily understood from the previous explanation of the gasification method, the following provides a supplementary explanation of a summary of preferable constitutions of each treatment chamber.

The solvent removal chamber and solid sublimation chamber, or combination solvent removal/solid sublimation chamber can each have a constitution similar to a treatment chamber like that used in gasification devices of the prior art. These treatment chambers are preferably composed of a closed space in particular, and thus, a sealed container, tank, chamber and so forth made of a strong metal material such as stainless steel is preferable.

Although the solvent removal chamber and solid sublimation chamber may be composed mutually independently and allow a solid carrier to be transported through a connecting pipe and so forth, the solvent removal chamber and following solid sublimation chamber are preferably arranged adjacent to each other separated by an opening and closing partition (such as a gate valve).

The solvent removal chamber and solid sublimation chamber, or combination solvent removal/solid sublimation chamber, are each required to be provided with a heating device for vaporizing the solvent and sublimating the solid. Here, the heating device of a combination solvent removal/solid sublimation chamber is preferably provided with a heating mechanism that heats the gasification solution and vaporizes the solvent used to prepare it, and a heating mechanism that gasifies the second solid material by sublimation. Thus, a heating device is preferably provided that allows the heating temperature to be adjusted to an arbitrary set temperature.

There are no particular restrictions on the heating device, examples of which include an infrared heater, a resistance heater and a high-frequency heater as previously explained. These heating devices may be arranged within each treatment chamber, on the chamber walls or around the external periphery corresponding to the design of the treatment chambers and so forth. Normally, arranging the heating device either on the chamber walls or around the external periphery so as to surround the treatment chamber is useful in terms of heating efficiency and workability.

The solvent removal chamber or combination solvent removal/solid sublimation chamber may be provided with various supply means for supplying gasification solution to the treatment chamber. For example, a dissemination means that introduces a gasification solution in the form of fine droplets, such as a spraying tube or nozzle, is preferably provided in the upper section of the treatment chamber as previously explained. Such a dissemination means may also be arranged on the sides or bottom of the treatment chamber as necessary because it further enhances the dissemination efficiency of the gasification solution. In addition, as is explained next, in the case of using a movable solid carrier, a special supply means may be provided that injects or supplies gasification solution to the solid carrier directly.

In addition, the solvent removal chamber or combination solvent removal/solid sublimation chamber preferably additionally has a solid carrier that holds the second solid material in the form of a fine solid powder. The solid carrier used here is preferably a porous material such as a stainless steel sintered compact, as was previously explained.

As was previously explained, in accordance with one preferable embodiment, the solid carrier is a portable solid carrier that can be moved from the solvent removal chamber to the solid sublimation chamber. An example of such a solid carrier is a cylindrical porous cell. A transport means such as a conveyor belt or a chuck mechanism is preferably used in combination for facilitating movement of the solid carrier.

According to another preferable embodiment, the solid carrier is preferably the porous inner walls, namely a lining, of the combination solvent removal/solid sublimation chamber. Examples of lining materials include porous metal materials and ceramic materials as previously explained. Although the lining normally covers the entire surface of the treatment chamber, it may also only partially cover the surface of the treatment chamber as necessary.

The solvent removal chamber or combination solvent removal/solid sublimation chamber as described above each have an exhaust port for transferring reactive gas generated by sublimation of the second solid material to a following treatment chamber. In addition, an inlet port for an inert carrier gas for transporting together with the reactive gas is additionally preferably provided in combination with this exhaust port.

The present invention also resides in a process and apparatus for forming a thin film from a solid material. The thin film formation process of the present invention comprises, in addition to the following three steps essential for the previously described gasification method according to the present invention, namely:

a solution preparation step wherein a first solid material is dissolved in a solvent to prepare a gasification solution, a solvent removal step wherein a second solid material is separated by removing the solvent used to prepare the gasification solution from that solution, and a solid sublimation step wherein a reactive gas is generated by sublimating the second solid material, a film formation step wherein the thin film is deposited on a treated substrate by using the reactive gas generated in the solid sublimation step as raw material. The solution preparation step, solvent removal step and solid sublimation step can each be carried out advantageously in the manner previously described.

There are no particular restrictions on the film formation step, examples of which include sputtering, vacuum vapor deposition, epitaxial growth, PVD and CVD as previously mentioned. In the case of CVD, for example, after the treated substrate on which the thin film is to be formed (such as a silicon wafer) is arranged inside a vacuum-compatible CVD device, the reactive gas generated in the solid sublimation step is supplied to the substrate either alone or in combination with another reactive gas. The molecules of the reactive gas are then excited by thermal energy, plasma discharge or laser radiation and so forth, causing the occurrence of a chemical reaction for forming the film. A thin film of a desired film thickness is thus formed on the surface of the substrate. As the amount of reactive gas supplied to the CVD device is preliminarily controlled to the amount required for film formation in accordance with the controlled gasification method of the present invention, the thickness of this thin film is constant and its composition is uniform.

Moreover, the present invention resides in an apparatus for carrying out the process for forming a thin film as described above, namely an apparatus for forming a thin film from a solid material comprising:

a solvent removal chamber provided with an inlet port for a gasification solvent containing a first solid material and a solvent in which it is dissolved, a heating device that vaporizes the solvent used to prepare the gasification solution by heating that solution, and an exhaust port that removes the vaporization product of the solvent, a solid sublimation chamber either also used as the solvent removal chamber or arranged communicably adjacent to it, and provided with a heating device that gasifies a second solid material separated by removal of the solvent by sublimation, and a film formation chamber wherein the thin film is deposited on a treated substrate using as raw material the reactive gas generated from the second solid material in the solid sublimation chamber or combination solvent removal/solid sublimation chamber.

In the thin film formation apparatus of the present invention, although arbitrary modifications may be respectively added to the solvent removal chamber and solid sublimation chamber as necessary, they normally may be composed in the same manner as the treatment chambers used in the gasification apparatus previously described.

Although there are no particular restrictions on the film formation chamber, it includes a sputtering device, a vacuum vapor deposition device, an epitaxial growth device, a PVD device or a CVD device, and so forth, as previously described. A CVD device, for example, may be provided with a vacuum-compatible reaction chamber, a holder that holds the substrate to be treated, a shower head for supplying the reactive gas and an exhaust port. Furthermore, since CVD devices and other film formation devices have already been explained in detail in various technical documents, those documents should be referred to for further details.

EXAMPLES

Examples of the present invention will be described hereinafter with reference to the drawings. Furthermore, it should be noted that the present invention is not limited to these examples.

Figure 1:
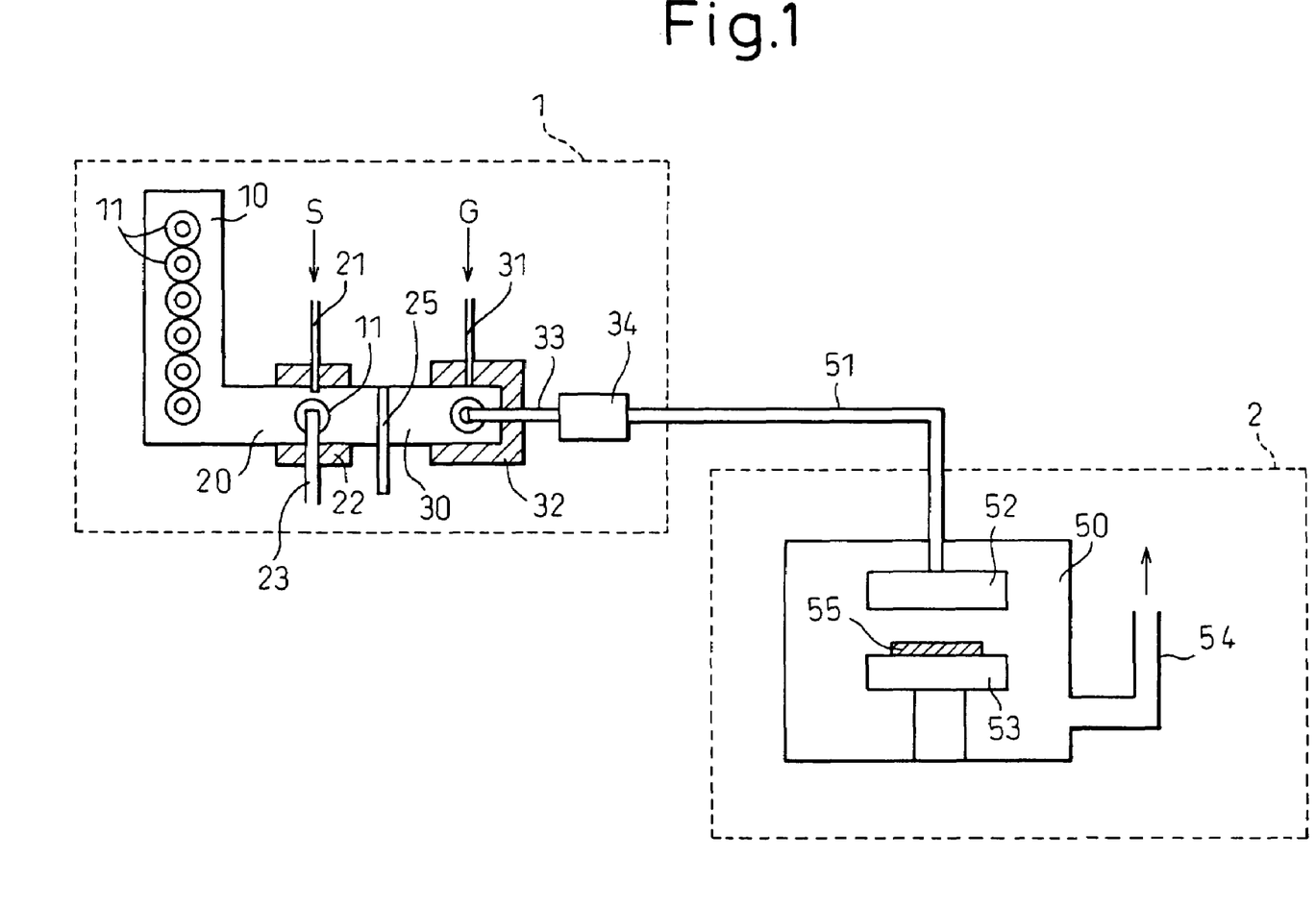
FIG. 1 is a flow chart schematically depicting a preferable embodiment of a thin film formation apparatus according to the present invention.
Figure 2:
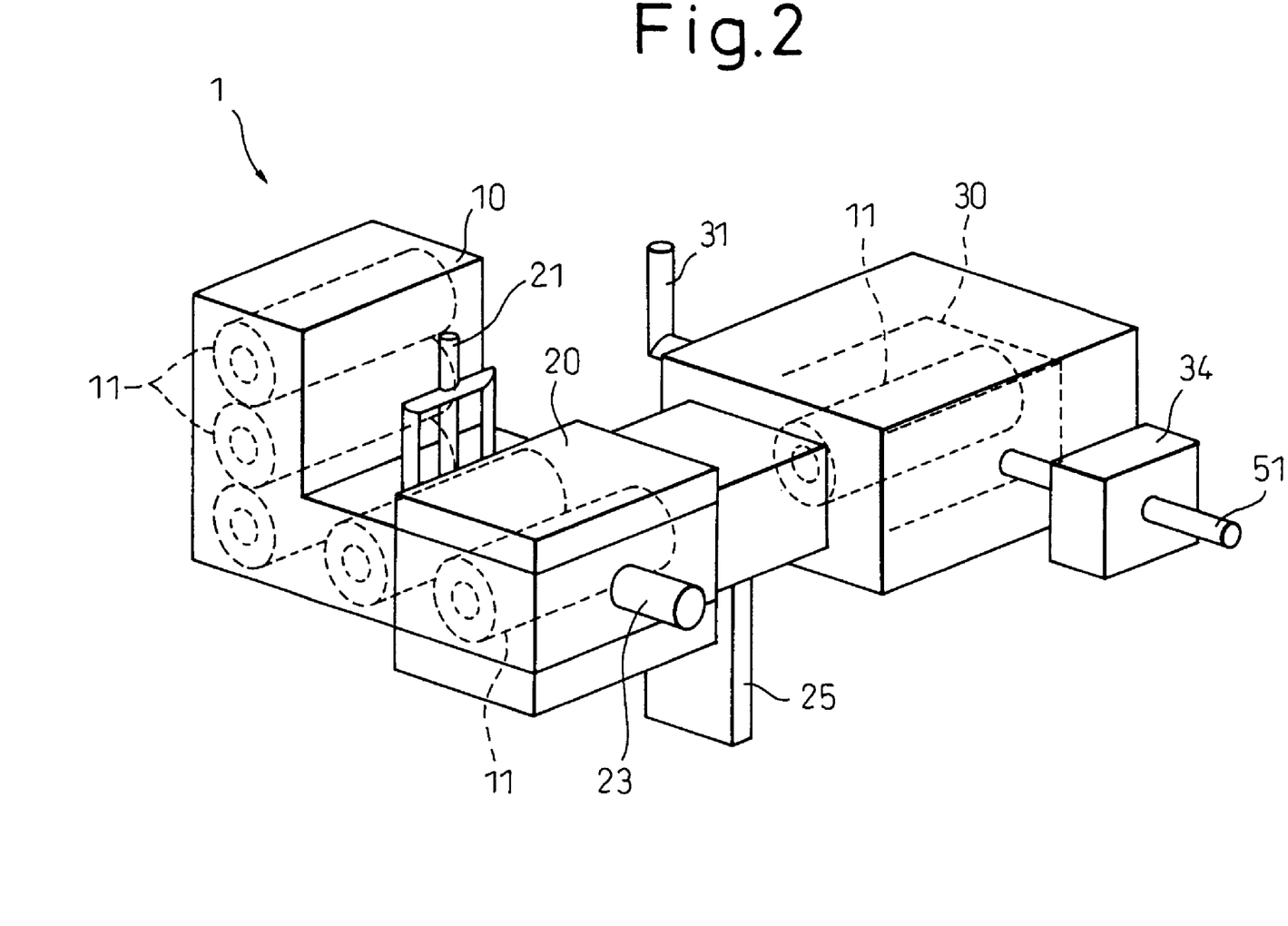
FIG. 2 is a perspective view schematically depicting a preferable embodiment of a gasification apparatus according to the present invention.

FIG. 1 is a flow chart schematically depicting a preferable embodiment of a thin film formation apparatus according to the present invention. In thin film formation apparatus 2 shown in FIG. 1, the gasification apparatus 1 of the present invention is arranged in its prior stage, and gasification apparatus 1 employs a two chamber system consisting of solvent removal chamber 20 and solid sublimation chamber 30. The constitution of gasification apparatus 1 is also explained with the perspective view shown in FIG. 2. Furthermore, it should be understood that the gasification apparatus 1 of FIG. 2 is shown with a portion of the apparatus omitted to simplify the explanation.

Gasification apparatus 1 is provided with the major elements of treatment preparation chamber 10, solvent removal chamber 20 and solid sublimation chamber 30. As shown in the drawing, a large number of cylindrical raw material cells 11 composed of stainless steel sintered product are installed in treatment preparation chamber 10. Each raw material cell 11 is 30 mm in diameter and 80 mm in length. Raw material cells 11 are transported one at a time to solvent removal chamber 20. A suitable amount of gasification solution S required for film formation is dropped from an accessory gasification solution injection port 21 onto raw material cell 11 that has been transported to solvent removal chamber 20. The gasification solution is a solution that is prepared by dissolving a solid film formation raw material in a solvent, and may be prepared in situ at the work site or prepared at a different work site or factory, and may be connected to injection port 21 shown in the drawing. The film formation raw material used here (the first solid material as referred to in the present invention) is $Pb(DPM)_2$, and is dissolved in THF at a concentration of 0.3 mol %. As the raw material cell 11 is porous, the gasification solution is uniformly absorbed into the cell.

Following completion of absorption of the gasification solution, the solvent removal chamber is heated to about 90° C. with an accessory heater (resistance heating heater) to vaporize only the solvent of the gasification solution. As the solvent is removed from raw material cell 11, the raw material solid (the second solid material as referred to in the present invention) precipitates in the form of a fine solid. Furthermore, as the heating performed here is only the heating required to vaporize the solvent, there is no occurrence of decomposition and so forth of the raw material solid, and decomposition products that cause the formation of particles are not formed. The vaporized solvent is charged to the outside from an exhaust port 23.

After the raw material solid has finished precipitating, a gate valve 25 that separates solvent removal chamber 20 and solid sublimation chamber 30 opens, raw material cell 11 is moved from solvent removal chamber 20 to solid sublimation chamber 30, and gate valve 25 again closes. Although not shown in the drawing, a belt conveyor is used to move raw material cell 11.

Solid sublimation chamber 30 is heated to about 260° C. by an accessory heater (resistance heating heater) 32 in the state in which solid sublimation chamber 30 is sealed. The raw material solid adhered to raw material cell 11 is sublimated, and the gas (the reactive gas as referred to in the present invention) fills the inside of the chamber. After a carrier gas G introduced from carrier gas inlet tube 31 is expelled, the generated reactive gas is led to thin film formation device 2 after passing through conduit 33, flow meter (MFC) 34 and conduit 51. Flow meter 34 is able to lead the reactive gas required for film formation into thin film formation apparatus 2 while controlling its flow rate.

Thin film formation apparatus 2 is a normal pressure CVD device provided with a vacuum-compatible reaction chamber 50, a holder 53 equipped with a heater for holding a treated substrate 55 (here, a silicon substrate), a shower head 52 for supplying the reactive gas, and an exhaust port 54. When film formation is carried out under prescribed conditions in this thin film formation apparatus 2, a thin oxide film of $Pb(DPM)_2$ is formed at a uniform thickness on silicon substrate 55 without being accompanied by particle contamination and so forth.

As there is no residual accumulation of gasification solution S inside solvent removal chamber 20 used in this embodiment, and fine particles of raw material solid do not remain in solid sublimation chamber 30 or raw material cell 11, treatment is able to proceed to the next raw material solid gasification process or thin film formation process without having to clean these treatment chambers or after performing a simple cleaning operation. Raw material cell 11 can also be returned to the treatment preparation chamber without requiring any cleaning treatment whatsoever.

FIGS. 3A to 3D are a cross-sectional view showing the actual order in which a combination solvent removal/solid sublimation chamber is used in another preferable embodiment of a gasification apparatus according to the present invention. This combination solvent removal/solid sublimation chamber 40 is composed of a sealed tank made of stainless steel, and its inner walls are lined with a metal sponge (stainless steel sintered product) lining 41. The thickness of lining 41 is about 20 mm. As shown in each drawing, a first conduit 42 provided with a valve 43, a second conduit 45 provided with a valve 46, and a third conduit provided with a valve 47 and a flow meter (MFC) 44 are connected to combination solvent removal/solid sublimation chamber 40. The end of first conduit 42 terminates in the upper section of combination solvent removal/solid sublimation chamber 40, and a dissemination nozzle 49 is attached thereto.

A raw material solid can be gasified according to the following procedure using the combination solvent removal/solid sublimation chamber 40 shown in the drawing.

Figure 3A:
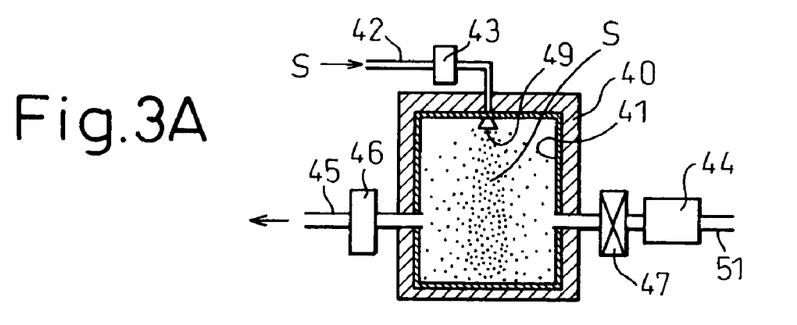
FIGS. 3A to 3D are a cross-sectional view showing, in order, the operation of another preferable embodiment of a gasification apparatus according to the present invention.

To begin with, as shown in FIG. 3A, after closing valve 47 of combination solvent removal/solid sublimation chamber 40, a suitable amount of gasification solution S required for film formation is introduced into combination solvent removal/solid sublimation chamber 40 from first conduit 42. Gasification solution S is the product of dissolving a raw material solid (referred to as a first solid material in the present invention) in the form of $Pb(DPM)_2$ in THF to a concentration of 0.3 mol %. Gasification solution S is dispersed within combination solvent removal/solid sublimation chamber 40 by dissemination nozzle 49, and uniformly absorbed into lining 41. Discharge of excess gas is carried out with second conduit 45 through opened valve 46.

Figure 3B:
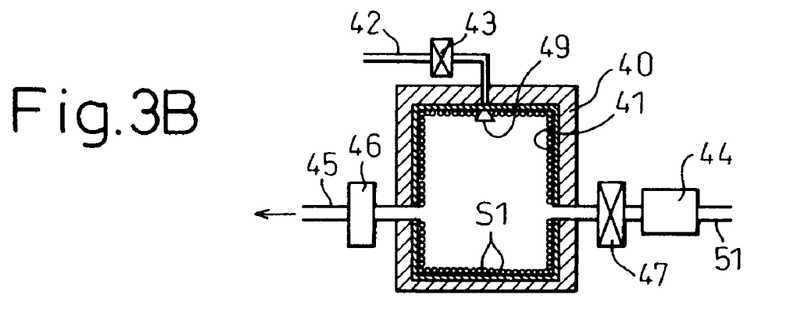

As shown in FIG. 3B, after absorbing the gasification solution into lining 41, solvent is removed in the state in which valves 43 and 47 are closed. Only the solvent of gasification solution S is removed by heating combination solvent removal/solid sublimation chamber 40 at about 90° C. with an accessory heater (resistance heating heater, not shown). As the solvent is removed from lining 41, the raw material solid (a second solid material as referred to in the present invention) precipitates on the surface of lining 41 in the form of fine solid particles S1. Furthermore, as the heating carried out here is the heating required to vaporize the solvent, there is no decomposition and so forth of the raw material solid, and decomposition products that cause the generation of particles are not formed. As valve 46 is open, the vaporized solvent is discharged to the outside from second conduit 45.

Figure 3C:
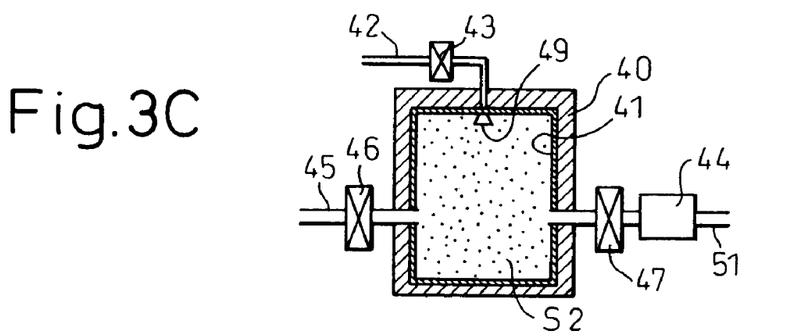

Following completion of precipitation of the raw material solid, as shown in FIG. 3C, valves 43, 46 and 47 are closed to seal combination solvent removal/solid sublimation chamber 40. Combination solvent removal/solid sublimation chamber 40 is then heated to about 260° C. by an accessory heater (resistance heating heater also used for the previously mentioned solvent removal) while maintaining this sealed state. The raw material solid adhered to lining 41 is sublimated, and that gas (referred to as reactive gas in the present invention) S2 fills the inside of the chamber.

Figure 3D:
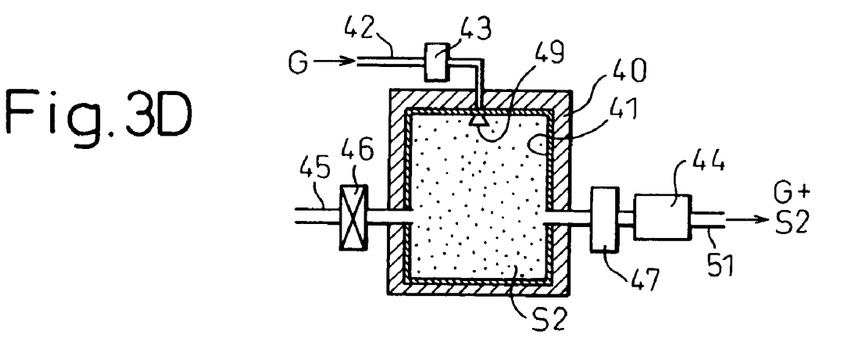

Then, as shown in FIG. 3D, the generated reactive gas S2 is discharged. Valves 43 and 47 are opened while leaving valve 46 closed. When a carrier gas (here, nitrogen gas) G is introduced from the first conduit into combination solvent removal/solid sublimation chamber 40, reactive gas S2 is expelled by carrier gas G, discharged through valve 47, flow meter (MFC) 44 and third conduit 51, and sent to a following film formation device (not shown).

As there is no gasification solution or fine particles of raw material solid remaining inside combination solvent removal/solid sublimation chamber 40 after going through the treatment process described above, the process is able to proceed to the gasification process of the next raw material solid without having to clean the inside of the chamber or only perform simple cleaning work.

As has been described in detail above, according to the gasification method and apparatus of the present invention, a solid material can be gasified easily and in a stable manner, and the resulting reactive gas can be advantageously used in a subsequent film formation step.

In addition, according to the film formation process and apparatus of the present invention, a thin film can be formed both easily and in a stable manner without being accompanied by deterioration of composition or properties during thin film formation, or the generation of debris and particles.

Moreover, as the thin film that is formed does not contain defects, the use of the present invention allows the production of high-performance semiconductor devices and other electronic devices with a good yield.

Moreover, according to the present invention, by preparing a fixed amount of raw material solution required for film formation, and gasifying this solution following solvent removal and sublimation of the solid raw material, the formation of raw material decomposition products can be suppressed and, as only the required amount of raw material is gasified, decomposition of the raw material gas can be prevented, and a stable supply of raw material gas can be secured.

The invention claimed is:

1. An apparatus for gasifying a solid material comprising:
   a solvent removal chamber provided with an inlet port of a gasification solution containing a first solid material and a solvent in which it is dissolved, a heating device that vaporizes the solvent used to prepare the gasification solution by heating that solution, and an exhaust port that removes the vaporization product of the solvent, and
   a solid sublimation chamber either also used as the solvent removal chamber or arranged communicably adjacent to it, and provided with a heating device that gasifies a second solid material corresponding to the first solid material, separated by removal of the solvent, by sublimation, and
   wherein the solvent removal chamber and the following solid sublimation chamber are arranged to be separated by an opening and closing partition.

2. An apparatus for gasifying a solid material as set forth in claim 1, wherein the combination solvent removal/solid sublimation chamber is provided with a heating device capable of adjusting the heating temperature to vaporize the solvent used prepare the gasification solution by heating it, and gasify the second solid material by sublimation.

3. An apparatus for gasifying a solid material as set forth in claim 1, wherein the solvent removal chamber and the solid sublimation chamber, or the combination solvent removal/solid sublimation chamber, are respectively composed of closed spaces.

4. An apparatus for gasifying a solid material as set forth in claim 1, wherein the solvent removal chamber or combination solvent removal/solid sublimation chamber is provided with a dissemination means that introduces the gasification solution in the form of fine droplets.

5. An apparatus for gasifying a solid material as set forth in claim 1, wherein the solvent removal chamber or the combination solvent removal/solid sublimation chamber additionally has a solid carrier to which the second solid material is adhered in the form of fine solid particles.

6. An apparatus for gasifying a solid material as set forth in claim 5, wherein the solid carrier is a porous material arranged in the solvent removal chamber.

7. An apparatus for gasifying a solid material as set forth in claim 6 additionally having a transport means that moves the porous material from the solvent removal chamber to the solid sublimation chamber.

8. An apparatus for gasifying a solid material as set forth in claim 5, wherein the solid carrier is a porous inner wall of the combination solvent removal/solid sublimation chamber.

9. An apparatus for gasifying a solid material as set forth in claim 5, wherein the solid carrier is composed of a porous metal material.

10. An apparatus for gasifying a solid material as set forth in claim 5, wherein the solid carrier is composed of a porous ceramic material.

11. An apparatus for gasifying a solid material as set forth in claim 1, wherein the solid sublimation chamber or combination solvent removal/solid sublimation chamber is additionally provided with a carrier gas inlet for transferring reactive gas generated by sublimation of the second solid material to a following treatment chamber.

12. An apparatus for gasifying a solid material as set forth in claim 1, wherein the first solid material is composed of at least one type of organometallic compound.

13. An apparatus for gasifying a solid material as set forth in claim 12, wherein the organometallic compound is selected from the group consisting of $Pb(DPM)_2$, $Zr(DPM)_4$, $Ti(iPrO)_2(DPM)_2$, $Ba(DPM)_2$, $Sr(DPM)_2$, $Ta(O-Et)_4$ and $Bi(DPM)_3$.

14. An apparatus for forming a thin film from a solid material comprising:
   a solvent removal chamber provided with an inlet port of a gasification-solution containing a first solid material and a solvent in which it is dissolved, a heating device that vaporizes the solvent used to prepare the gasification solution by heating that solution, and an exhaust port that removes the vaporization product of the solvent,
   a solid sublimation chamber either also used as the solvent removal chamber or arranged communicably adjacent to it, and provided with a heating device that gasifies a second solid material corresponding to the first solid material, separated by removal of the solvent, by sublimation, and
   a film formation chamber wherein the thin film is deposited on a treated substrate using as raw material the reactive gas generated from the second solid material in the solid sublimation chamber or combination solvent removal/solid sublimation chamber;
   wherein the solvent removal chamber and the following solid sublimation chamber are arranged to be separated by an opening and closing partition.

15. An apparatus for forming a thin film from a solid material comprising;
   a solvent removal chamber provided with an inlet port of a gasification solution containing a first solid material and a solvent in which it is dissolved, a heating device that vaporizes the solvent used to prepare the gasification solution by heating that solution, and an exhaust port that removes the vaporization product of the solvent,
   a solid sublimation chamber either also used as the solvent removal chamber or arranged communicably adjacent to it, and provided with a heating device that gasifies a second solid material corresponding to the first solid material, separated by removal of the solvent, by sublimation, and
   a film formation chamber wherein the thin film is deposited on a treated substrate using as raw material the reactive gas generated from the second solid material in the solid sublimation chamber or combination solvent removal/solid sublimation chamber;
   said apparatus being provided with a gasification apparatus as set forth in any one of claims 2 to 13.

* * * * *